(12) United States Patent
Kishi

(10) Patent No.: US 8,120,438 B2
(45) Date of Patent: Feb. 21, 2012

(54) TEMPERATURE COMPENSATED CRYSTAL OSCILLATOR

(75) Inventor: Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 12/759,171

(22) Filed: Apr. 13, 2010

(65) Prior Publication Data

US 2010/0265000 A1  Oct. 21, 2010

(30) Foreign Application Priority Data

Apr. 21, 2009  (JP) .................... 2009-102568

(51) Int. Cl.
*H03B 5/32* (2006.01)
*H01L 41/047* (2006.01)

(52) U.S. Cl. ............... 331/158; 331/116 R; 331/176; 310/315; 310/363

(58) Field of Classification Search ......... 331/116 R, 331/116 FE, 158, 163, 66, 176; 310/315, 310/346, 363

See application file for complete search history.

(56) References Cited

U.S. PATENT DOCUMENTS

| 3,818,254 A | 6/1974 | Persson |
| 4,259,606 A | 3/1981 | Vig |
| 4,924,132 A | 5/1990 | Ziegler |
| 4,949,055 A | 8/1990 | Leitl |
| 5,955,825 A * | 9/1999 | Uno ................ 310/360 |
| 6,127,661 A | 10/2000 | Fry |
| 2008/0061899 A1 | 3/2008 | Stolpman |
| 2008/0297268 A1 | 12/2008 | Matsui et al. |

FOREIGN PATENT DOCUMENTS

| DE | 3629588 A1 | 3/1988 |
| JP | 2503834 Y2 | 7/1996 |
| JP | 2008-300978 A | 12/2008 |

OTHER PUBLICATIONS

European Search Report dated Aug. 2, 2010, issued in corresponding European Patent Application No. 10160211.

* cited by examiner

*Primary Examiner* — Ryan Johnson
(74) *Attorney, Agent, or Firm* — Westerman, Hattori, Daniels & Adrian, LLP

(57) ABSTRACT

A temperature compensated crystal oscillator is mounted to a board. A quartz resonator includes a quartz chip that generates an oscillation frequency. A resistive element is formed on the quartz chip. A temperature sensor is located closer to the board than the quartz resonator. The compensation part compensates for a change in the oscillation frequency generated by the quartz resonator based on a value of a current flowing in the resistive element and an output of the temperature sensor.

6 Claims, 15 Drawing Sheets

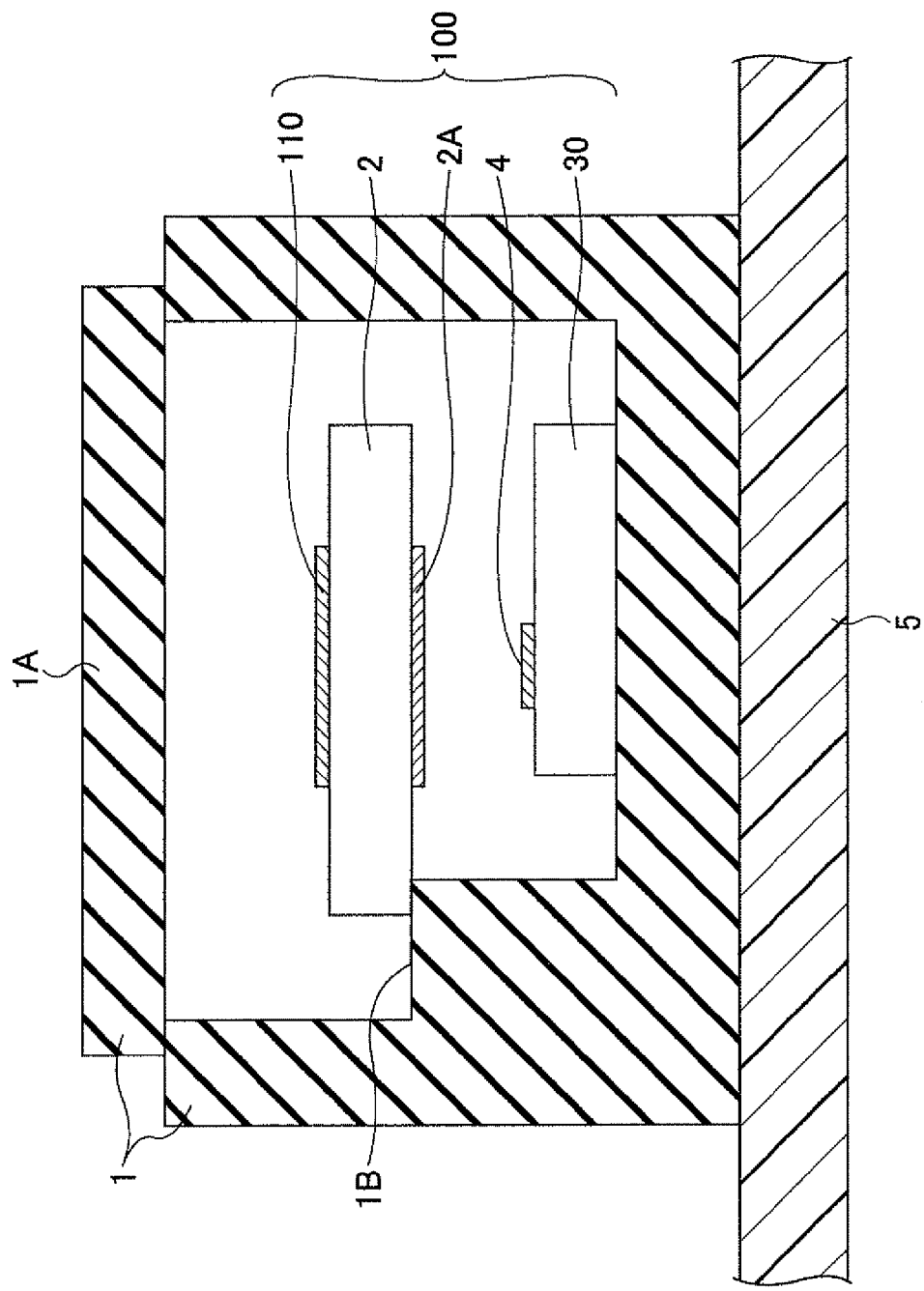

FIG.10A
FIG.10B
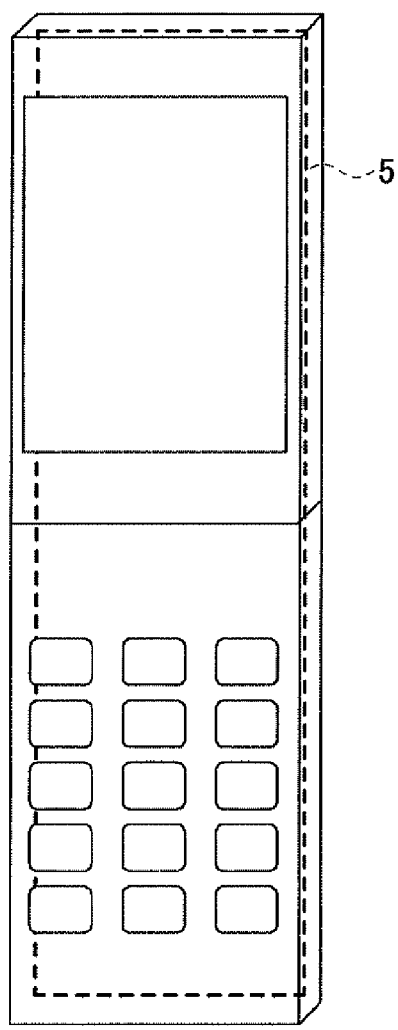
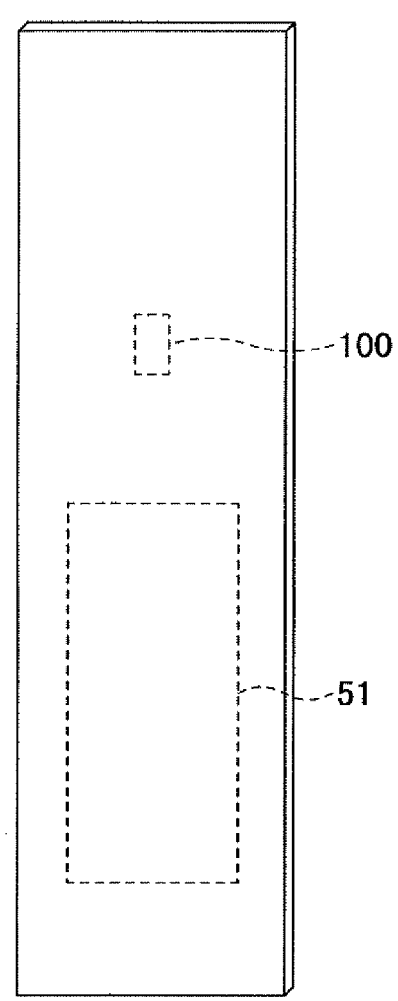

TEMPERATURE COMPENSATED CRYSTAL OSCILLATOR

CROSS-REFERENCE TO RELATED APPLICATIONS

This application is based upon and claims the benefit of priority of the prior Japanese Patent Application No. 2009-102568, filed on Apr. 21, 2009, the entire contents of which are incorporated herein by reference.

FIELD

The present invention relates to a temperature compensated crystal oscillator.

BACKGROUND

A temperature compensated crystal oscillator (TCXO) is used for various electronic equipments, such as a communication equipment or an information technology equipment.

FIG. 1 is a cross-sectional view of a conventional temperature compensated crystal oscillator. The conventional temperature compensated crystal oscillator includes a quartz resonator 20 and an integrated circuit (IC) 30, which are arranged in the interior of a housing 1. The quartz resonator 20 has, as illustrated in FIG. 1, a piece of quartz (quartz chip) 2 and a pair of excitation electrodes 2A and 2B connected to the quartz chip 2.

The housing 1 is made of a ceramic and has a lid part 1A. The quartz resonator 20 and the IC 30 are situated inside the housing 1 and the housing 1 is sealed with a desiccated nitrogen gas filled inside the housing 1. The temperature compensated crystal oscillator is mounted to a printed circuit board 5 by attaching the bottom of the housing 1 to the printed circuit board 5.

The quartz chip 2 of the quartz resonator 20 is connected to an inner wall 1B of the housing 1 so that the quartz chip 2 is located at a center of the interior space of the housing 1. For example, the quartz chip 2 is formed by AT cutting to have a thickness with which a desired resonant frequency is obtained. The excitation electrodes 2A and 2B are formed on opposite surfaces of the quartz chip 2, respectively. Thin-film electrodes made of gold (Au) are used as the excitation electrodes 2A and 2B.

The IC 30 is arranged in the bottom part of the interior space of the housing 1. A temperature sensor 4 is attached to the IC 30 to detect a temperature of the IC 30. The temperature sensor 4 is a temperature-detecting device of which resistance value varies in response to a temperature of the IC 30. For example, a nichrome wire can be used as the temperature sensor 4.

FIG. 2 is a circuit diagram of the conventional temperature compensated crystal oscillator illustrated in FIG. 1. The IC 30 includes a variable capacitor 31, an inverter 32, an output buffer circuit 33, a compensation circuit 34, and a memory 35.

The variable capacitor 31 and the inverter 32 are connected to the excitation electrodes 2A and 2B of the quartz resonator 20 so as to form a loop form oscillator circuit containing the quartz resonator 20.

The output buffer circuit 33 changes an oscillation signal acquired by the oscillation circuit into a clock signal, and outputs the clock signal to an external part. Although the output buffer circuit 33 includes a plurality of inverters in many cases in practice, only one inverter is illustrated in FIG. 2 for the sake of simplification of explanation.

The variable capacitor 31 is a variable capacitance element of which capacitance is variable. The variable capacitor 31 is inserted into the oscillator circuit in series in order to make the electrostatic capacitance value of the loop-form oscillator circuit variable. The variable capacitor 31 is formed using a variable-capacitance capacitor such as a varicap diode, and the electrostatic capacitance thereof is variable in response to a voltage applied by a compensation circuit 34.

The memory 35, which is incorporated in the IC 30, stores data representing a reverse characteristic of a frequency temperature characteristic of the quartz resonator 20. The data is used for converting an electric current value representing a temperature signal into an electric current value supplied from the compensation circuit 34 to the variable capacitor 31. The compensation circuit 34 applies a voltage to the variable capacitor 31 in response to the temperature signal (electric current value) representing a temperature detected by the temperature sensor 4 by referring to the data stored in the memory 35. The compensation circuit 34 has a circuit structure such as, for example, disclosed in Japanese Laid-Open Patent Application 2008-300978 (particularly, FIG. 3).

According to the above-mentioned structure, when the temperature detected by the temperature sensor 4 changes, the electrostatic capacity of the variable capacitor 31 is adjusted, and, thereby, the oscillation frequency is controlled to be constant against the temperature change.

The clock signal output from the output buffer circuit 33 of the temperature compensated crystal oscillator is used by a central processing unit (CPU) or a communication part contained in electronic equipments.

Additionally, Japanese Utility-Model Registration No. 2503834 discloses a related art.

With miniaturization of electronic equipment, high-density mounting is achieved especially in electronic equipment using a temperature compensated crystal oscillator. Particularly, high-density mounting is performed in portable equipment such as a cellular phone.

In order to realize such a high-density mounting, design flexibility in the interior of electronic equipment is restrained greatly. There is a case where a temperature compensated crystal oscillator must be mounted near a heat-generating part such as a transmitting unit in a cellular phone.

In the case of the transmitting unit of a cellular phone, a temperature may sharply increase when performing communication. A large part of heat generated in the transmitting unit is transferred to a temperature compensated crystal oscillator through a board on which the transmitting unit is mounted. If a temperature sensor is located near the board as is in the above-mentioned conventional structure, a temperature of the temperature sensor rises faster than a quartz resonator. Thus, a difference is generated between the temperature detected by the temperature sensor and the temperature of the quartz resonator. This results in inaccurate temperature compensation, and a frequency output from the temperature compensated crystal oscillator is changed undesirably. In order to eliminate such a problem, it is considered to attach the temperature sensor directly to the quartz resonator.

However, if the above-mentioned sharp temperature rise occurs, the quartz resonator is heated rapidly. Thus, it may be difficult to follow the temperature change even if the temperature change in the quartz resonator is detected by the temperature sensor attached to the quartz resonator.

SUMMARY

There is provided according to an embodiment a temperature compensated crystal oscillator mounted to a board, comprising: a quartz resonator including a quartz chip generating an oscillation frequency; a resistive element formed on the quartz chip; a temperature sensor located closer to the board than the quartz resonator; and a compensation part configured to compensate for a change in the oscillation frequency generated by the quartz resonator based on a value of a current flowing in the resistive element and an output of the temperature sensor.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIG. 3 is a cross-sectional view of a temperature compensated crystal oscillator according to a first embodiment;

FIG. 10A is perspective view of a cellular phone provided with the temperature compensated crystal oscillator according to the first embodiment;

FIG. 10B is a perspective view of a printed circuit board incorporated into the cellular phone illustrated in FIG. 10A;

DESCRIPTION OF EMBODIMENT(S)

A description will now be given, with reference to the drawings, of embodiments of the present invention.

Figure 1:
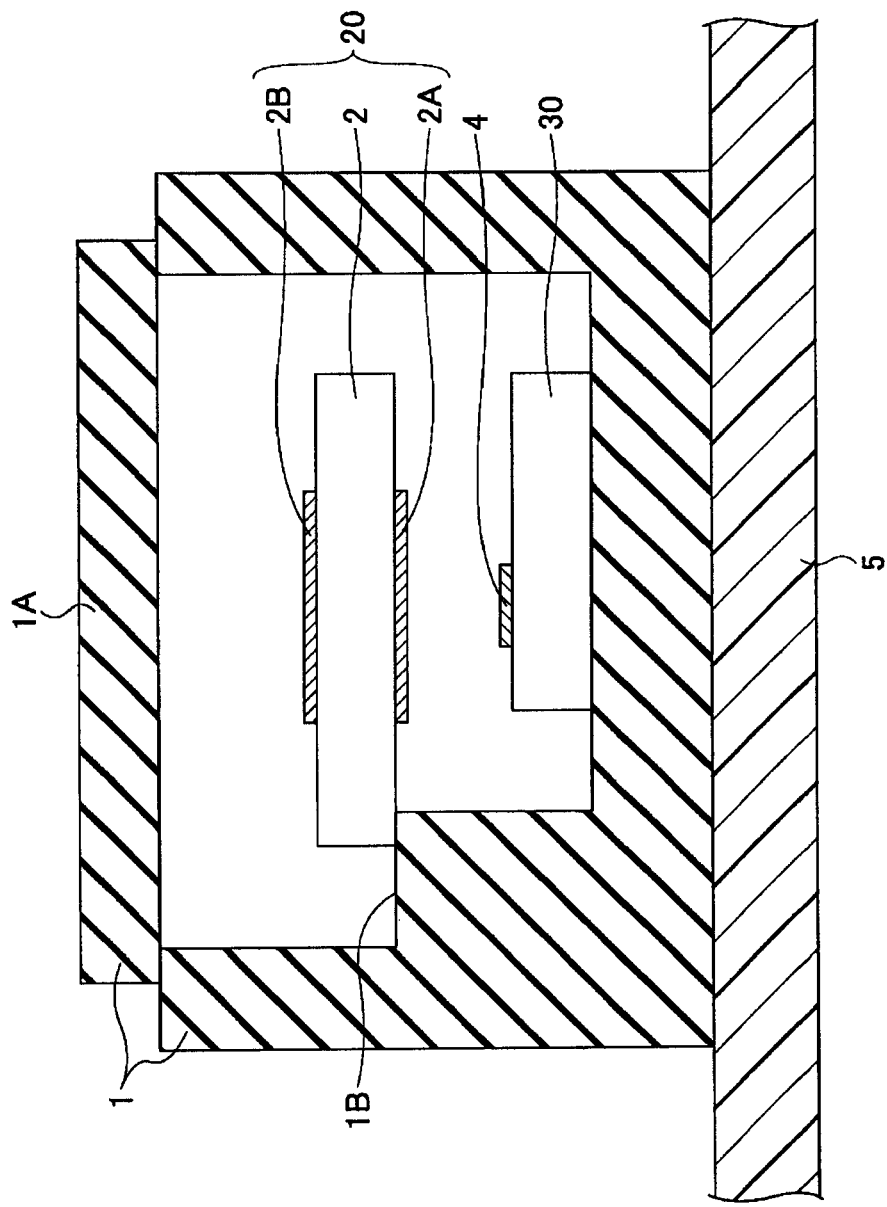
FIG. 1 is a cross-sectional view of a conventional temperature compensated crystal oscillator.

FIG. 3 is a cross-sectional view of a temperature compensated crystal oscillator according to a first embodiment. In FIG. 3, parts that are the same as the parts illustrated in FIG. 1 are given the same reference numerals, and descriptions thereof will be omitted.

The temperature compensated crystal oscillator 100 according to the first embodiment includes a quartz chip 2, an excitation electrode 2A, an integrated circuit (IC) 30, a temperature sensor 4 and a combined electrode 110, which are accommodated inside a housing 1. The temperature compensated crystal oscillator 100 is mounted to a board such as, for example, a printed circuit board 5. The a quartz chip 2, the excitation electrode 2A and the combined electrode 110 together form a quartz resonator 20A according to the first embodiment.

The combined electrode 110 is arranged on an upper surface of the quartz chip 2. The combined electrode 110 serves as a first temperature-detecting element, which directly detects a temperature of the quartz chip 2, and also serves as an excitation electrode, which makes a pair with the excitation electrode 2A arranged on a bottom surface of the quartz chip 2. That is, the combined electrode 110 is used as both an electrode (first temperature-detecting element) for detecting a temperature of the quartz chip 2 and one of the excitation electrodes attached to the quartz chip 2 of the quartz resonator. The combined electrode 110 may be a thin-film electrode, which can detect a temperature of the quartz chip 2. For example, a nichrome thin-film (Ni—Cr: an alloy containing nickel and chrome) may be used to form the combined electrode 110.

In the temperature compensated crystal oscillator 100 according to the first embodiment, the temperature sensor 4 attached to the IC 30 corresponds to a second temperature-detecting element located closer to the printed circuit board 5 than the combined electrode 110 corresponding to the first temperature-detecting element.

As mentioned above, the temperature compensated crystal oscillator 100 according to the first embodiment includes the two temperature-detecting elements, which are the combined electrode 110 attached to the quartz chip 2 and the temperature sensor 4 provided on the IC 30.

Although a gold thin-film is used as the excitation electrode 2A in the present embodiment, the material of the excitation electrode 2A is not limited to gold, and silver (Ag), aluminum (Al) or the like may be used.

It is noted that, in the temperature compensated crystal oscillator 100 according to the present embodiment, it is necessary to adjust the mass of the combined electrode 110 in order to prevent the natural frequency of the quartz chip 2 from being influenced because the combined electrode 110 also serves as an excitation electrode (refer to the excitation electrode 2B illustrated in FIG. 1) attached to the upper surface of the quartz chip 2 in the conventional temperature compensated crystal oscillator.

Figure 4A:
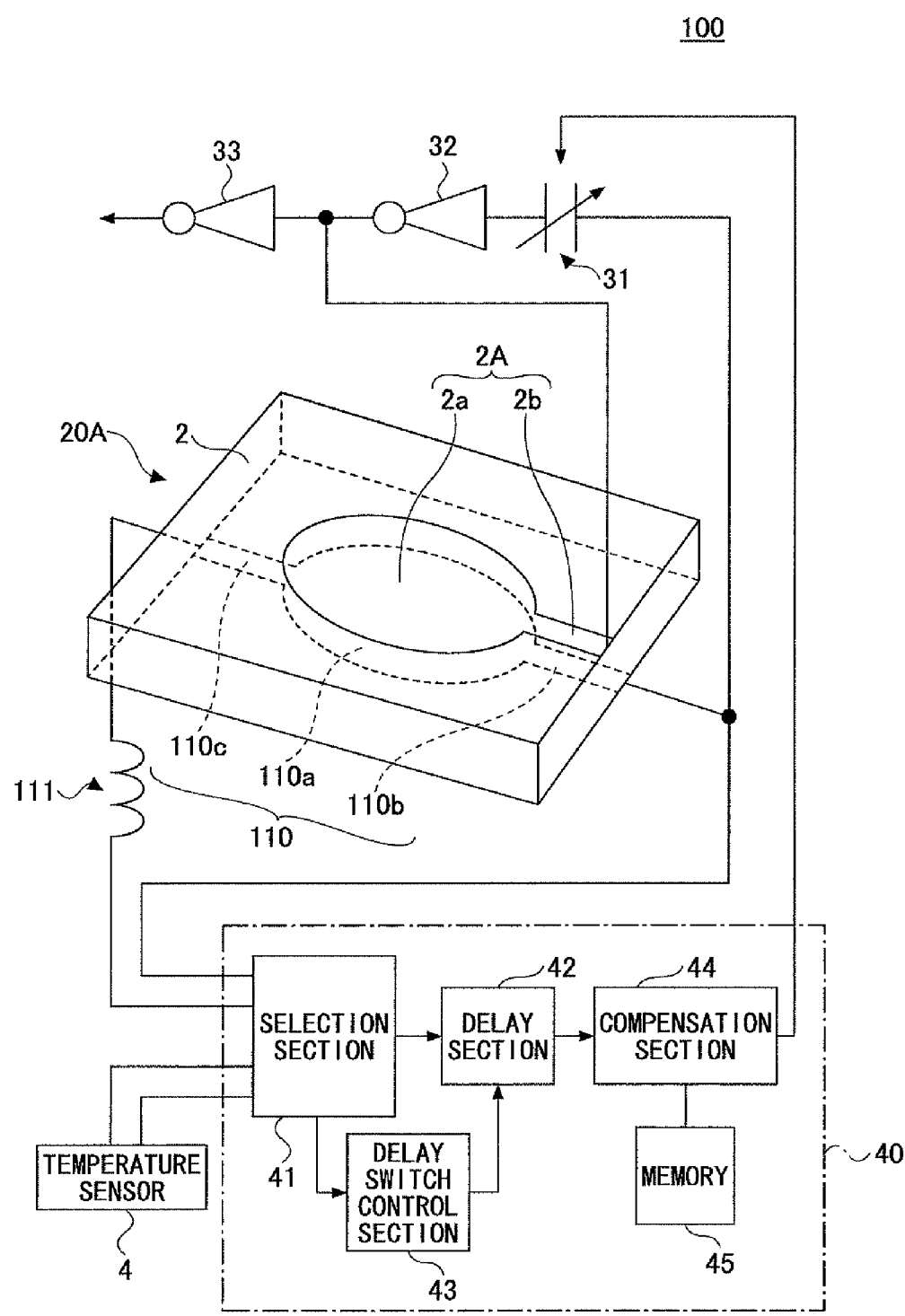
FIGS. 4A and 4B are circuit diagrams of the temperature compensated crystal oscillator according to the first embodiment.
Figure 4B:
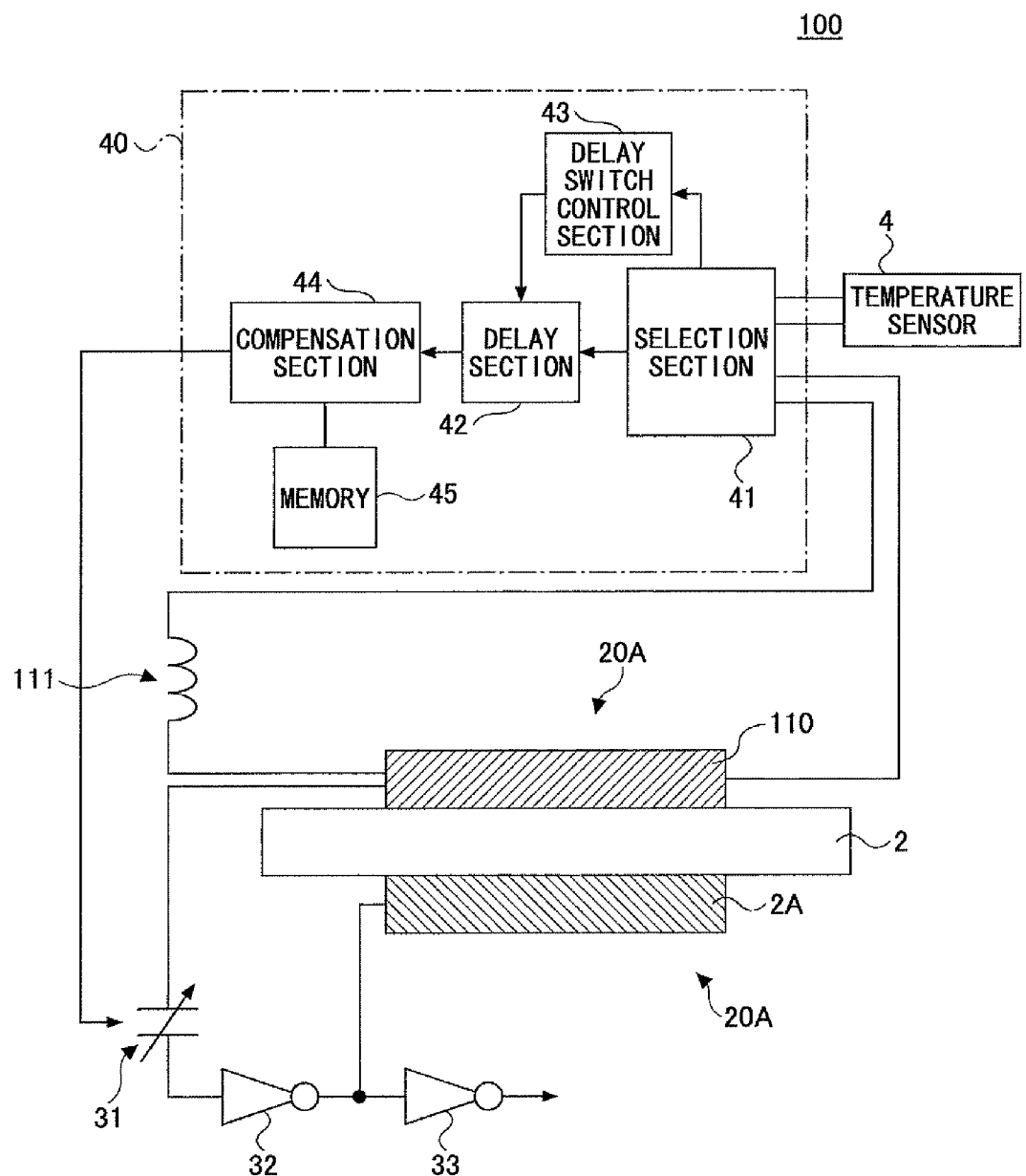
Figure 5:
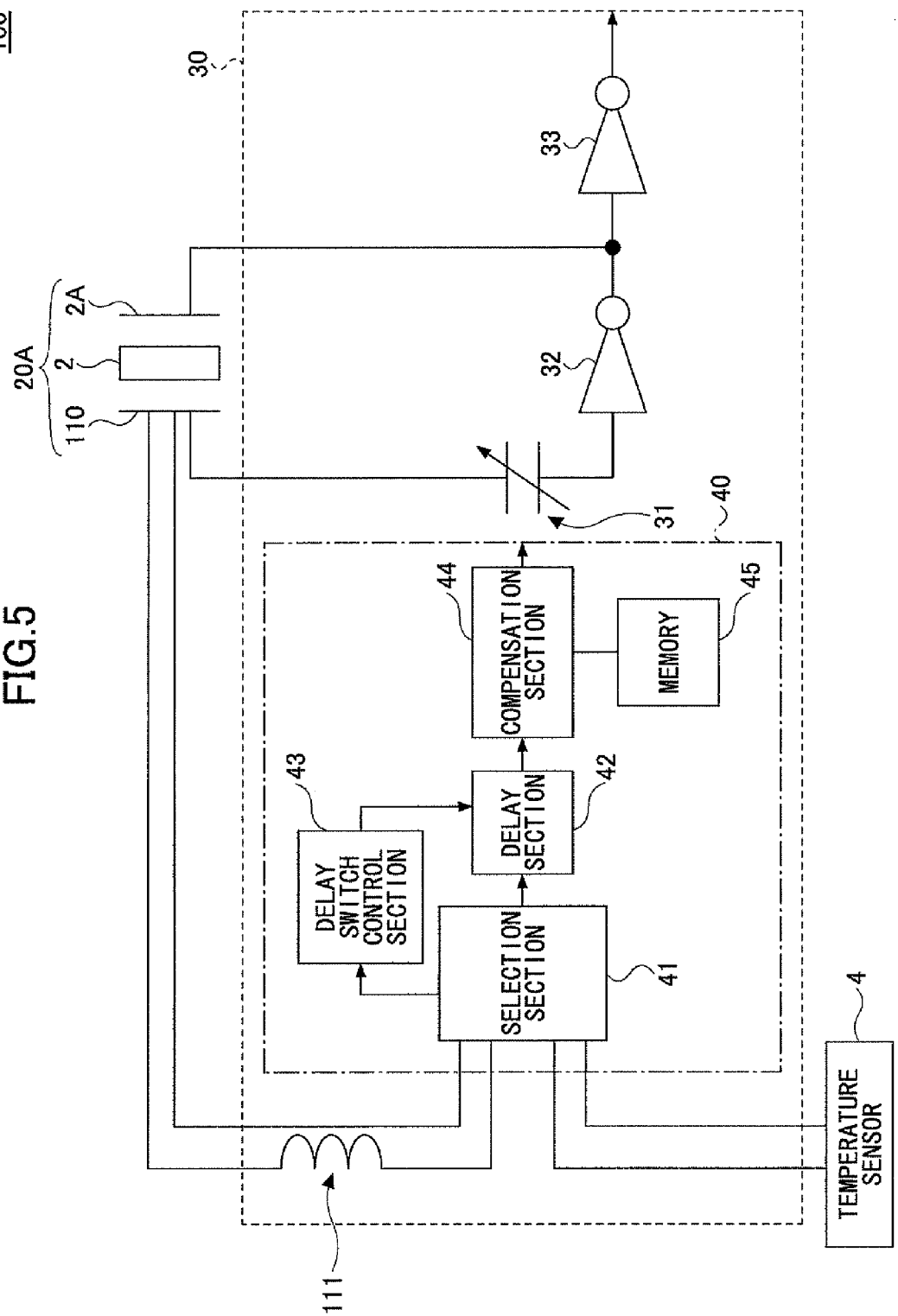
FIG. 5 is a circuit diagram of the temperature compensated crystal oscillator according to the first embodiment.

FIGS. 4A, 4B and 5 are circuit diagrams of the temperature compensated crystal oscillator 100 according to the first embodiment. In FIG. 4A, the quartz resonator 20A, which includes the quartz chip 2, the excitation electrode 2A and the combined electrode 110, is illustrated in a perspective view. In FIG. 4B, the quartz resonator 20A is illustrated in a cross-sectional view. In FIG. 5, the quartz chip 2, the excitation electrode 2A and the combined electrode 110 are illustrated as symbolic elements. It should be noted that the quartz resonator 20A illustrated in FIG. 4B is positioned upside down for the sake of convenience of illustration.

Figure 2:
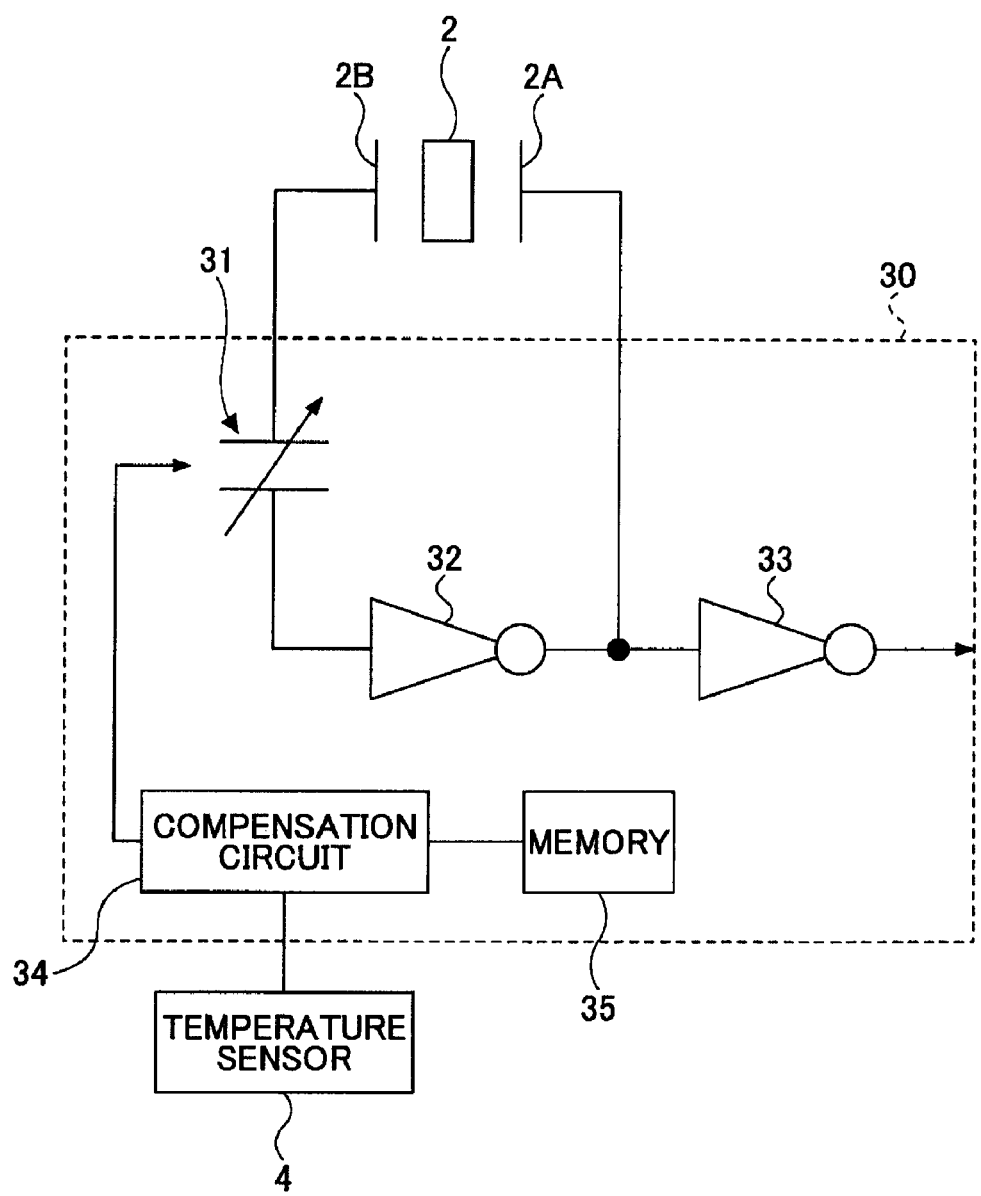
FIG. 2 is a circuit diagram of the conventional temperature compensated crystal oscillator illustrated in FIG. 1.

The temperature compensated crystal oscillator 100 according to the first embodiment includes a compensation part such as a compensation circuit 40, which is a part of the IC 30. The compensation circuit 40 includes a memory 45, which corresponds to the memory 35 (refer to FIG. 2) provided in the temperature compensated crystal oscillator illustrated in FIG. 1. The compensation circuit 40 will be explained in detail later.

As illustrated in FIG. 4A, the combined electrode 110 as a first electrode is attached to an upper surface of the quartz chip 2 having a planer shape. The upper surface of the quartz chip 2 is opposite to a bottom surface of the quartz chip 2, which faces the side where the printed circuit board 5 is located. The excitation electrode 2A as a second electrode is attached to the bottom surface of the quartz chip 2.

The excitation electrode 2A is positioned in the center portion of the bottom surface of the quartz chip 2. As illustrated in FIG. 4A, the excitation electrode 2A includes an electrode part 2a having an elliptical shape in a plan view and an extending part 2b extending from the electrode part 2a and along a longer axis of the electrode part 2a.

The combined electrode 110 is positioned in the center portion of the upper surface of the quartz chip 2. As illustrated in FIG. 4A, the combined electrode 110 includes an electrode part 110a having an elliptical shape in a plan view and a pair of extending parts 110b and 110c extending from the electrode part 110a and along a longer axis of the electrode part 110a.

The extending parts 110b and 110c of the combined electrode 110 are connected to the compensation circuit 40 through a coil 111 for alternative current interception.

The extending part 110b of the combined electrode 110 is also connected to an input side of a variable capacitor 31, and the extending part 2b of the excitation electrode 2A is also connected to an output side of an inverter 32. Thereby, the combined electrode 110 makes a pair with the excitation electrode 2A and is connected to the variable capacitor 31 and the inverter 32 in order to form a loop for an oscillation circuit.

An output buffer circuit 33 is connected to an output side of the inverter 32. An oscillation signal output from the output buffer circuit 33 is a final output of the temperature compensated crystal oscillator 100.

The compensation circuit 40, which is a part of the IC 30, includes a selection section 41, a delay section 42, a delay switch control section 43, a compensation section 44, and the memory 45.

Among those sections, the memory 45 is a memory provided in the IC 30. The memory 45 stores data indicating a reverse characteristic of a frequency/temperature characteristic of the quartz resonator 20A. The reverse characteristic of the frequency/temperature characteristic is used when converting an electric current value representing a temperature signal into a voltage to be applied to the variable capacitor 31. The compensation circuit 40 applies to the variable capacitor 31 the voltage corresponding to the temperature signals (electric current values), which are output from the temperature sensor 4 and the combined electrode 110, by referring to the data store in the memory 45.

It should be noted that, in the present embodiment, a resistance value of the combined electrode 110 is equal to a resistance value of the temperature sensor 4, and both the combined electrode 110 and the temperature sensor 4 are made of nichrome.

The combined electrode 110 and the temperature sensor 4 are connected to the selection section 41. The selection section 41 includes a comparator and a switch. The comparator compares a difference between temperatures detected by the temperature sensor 4 and the combined electrode 110 with a threshold value. The switch selectively switches an output of the selection section 41. That is, the selection section 41 selects and outputs the electric current value as temperature information indicating a temperature detected by one of the temperature sensor 4 and the combined electrode 110 by operating the switch.

Specifically, if the difference in the temperature between the temperature sensor 4 and the combined electrode 110 is equal to or greater than the threshold value, the selection section 41 outputs an electric current value as temperature information indicating the temperature detected by the temperature sensor 4. On the other hand, if the difference in the temperature between the temperature sensor 4 and the combined electrode 110 is smaller than the threshold value, the selection section 41 outputs an electric current value as temperature information indicating the temperature detected by the combined electrode 110.

As mentioned above, a degree of increase in the difference of the detected temperatures can be monitored by performing the determination as to whether the difference in the temperatures detected by the temperature sensor 4 and the combined electrode 110 is equal to or greater than the threshold value for each control cycle. Monitoring the degree of increase in the difference of the detected temperatures corresponds to monitoring whether the degree of increase in the temperature detected by the temperature sensor 4 is equal to or greater than the degree of increase in the temperature detected by the combined electrode 110 by a predetermined degree.

It should be noted that the comparison in the comparator is performed by comparing the electric current value indicating the difference between the temperatures detected by the temperature sensor 4 and the combined electrode 110 with an electric current value indicating the threshold value.

The delay section 42 is a delay circuit, which can delay an input signal and output the delayed input signal. For example, a digital delay line can be used for the delay circuit. The switching of whether to perform a delay process of the input signal by the delay section 42 is performed by the delay switch control section 43.

Specifically, if it is determined by the delay switch control section 43 that the electric current value output from the selection section 41 corresponds to the temperature detected by the temperature sensor 4, the delay section 42 is switched to a state where the delay process is performed. In this case, the delay section 42 outputs the electric current value indicating the temperature detected by the temperature sensor 4 by delaying by a predetermined time period. As a result of the correction, the compensation section 44 applies a voltage, which is based on the temperature detected by the temperature sensor 4, to the variable capacitor 31.

On the other hand, if the electric current value output from the selection section 41 is an output from the combined electrode 110, the delay section 42 is switched to a state where the electric current value indicating the temperature detected by the combined electrode 110 is not delayed and is output without change. As a result, the compensation section 44 applies a voltage based on the temperature detected by the combined electrode 110 is applied to the variable capacitor 31.

The switching process as to whether to perform the delay process in the delay section 42 is performed by the delay switch control section 43 by detecting the state of selection of the selection section 41.

If the temperature detected by the temperature sensor 4 is higher than the temperature detected by the combined electrode and the difference between the temperatures is equal to or greater than a predetermined value, the delay time period to delay the input signal by the delay section 42 is set to a time period obtained by subtracting a delay time of a feedback control from a delay time until the combined electrode 110 detects the same temperature as the temperature detected by the temperature sensor 4.

Here, the delay time (control delay time) of the feedback control is a time period required for a control from a time at which the electric current value indicating the temperature detected by the combined electrode 110 is transmitted to the compensation circuit 40 and until the capacitance of the variable capacitor 31 is changed by the compensation voltage.

That is, the predetermined time during which the delay section 42 delays the input signal is set to a time period obtained by subtracting the control delay time from a delay time due to a heat transfer of the combined electrode 110 with respect to the temperature sensor 4.

Thus, the delay time due to heat transfer is taken into consideration in order to compensate for a delay in temperature rise in the combined electrode 110 because the temperature of the temperature sensor 4 closer to the printed circuit board 5 than the combined electrode 110 rises faster than that of the combined electrode 110 in a case where, for example, a temperature of a heat-generating source such as a power amplifier rises rapidly and the heat generated by the power amplifier is transferred to the temperature sensor 4 and the combined electrode 110 through the printed circuit board 5.

Accordingly, even when a rapid temperature rise arises in the vicinity of the temperature compensated crystal oscillator 100, a temperature approximated the actual temperature of the quartz resonator 20A (quartz chip 2) can be derived by delaying the temperature information (electric current value) detected by the temperature sensor 4 by a predetermined time period and inputting the temperature information to the compensation circuit 40 with the delay.

It should be noted that because the delay time corresponding to the heat transfer to the combined electrode 110 relative to the heat transfer to the temperature sensor 4 depends on the structure of the temperature compensated crystal oscillator 100, the delay time may be measured prior to performing the temperature compensation. The control delay time may be derived based on, for example, a control cycle of the compensation circuit 40.

It should be noted that the delay switch control section 43 can be realized by, for example, a central processing unit (CPU). The determination process of the delay switch control section 43 will be explained in detail later with reference to FIG. 6.

The compensation section 44 converts the electric current value input from the delay section 42 into a compensation voltage, which has a reverse characteristic of the frequency/temperature characteristic of the quartz resonator 20A (quartz chip 2) by using the reverse characteristic stored in the memory 45, and outputs the thus-obtained compensation voltage. The compensation voltage output from the compensation section 44 is supplied as an output of the compensation circuit 40 to the variable capacitor 31. The compensation voltage output from the compensation circuit 40 is supplied to the variable capacitor 31 in order to control the electrostatic capacitance of the variable capacitor 31. That is, the electrostatic capacitance of the variable capacitor 31 is controlled based on the temperature detected by either one of the temperature sensor 4 and the combined electrode 110. Thus, even if an environmental temperature fluctuates, temperature compensation is performed so that a fluctuation in the oscillation frequency of the oscillation signal generated by the oscillation circuit is suppressed.

As mentioned above, in the present invention, the selection section 41 monitors a degree of increase in the difference between the detected temperatures of the temperature sensor 4 and the combined electrode 110 with respect to time in order to determine whether a degree of increase in the temperature detected by the temperature sensor 4 is greater than a degree of increase in the temperature detected by the combined electrode 110 by a predetermined degree.

However, the determination of whether a degree of increase in the temperature detected by the temperature sensor 4 is greater than a degree of increase in the temperature detected by the combined electrode 110 by a predetermined degree is not limited to the determination based on the degree of change in the temperature difference with respect to time. For example, the degree of increase in the temperature detected by the temperature sensor 4 and the degree of increase in the temperature detected by the combined electrode 110 may be monitored, and a determination may be made whether a difference between the degrees of increase in the temperatures is equal to or greater than a predetermined degree.

In FIG. 4B, the extending part 2b of the excitation electrode 2A and the extending parts 110b and 110c of the combined electrode 110 are omitted for the sake of convenience of explanation. Additionally, in FIG. 4B, the thicknesses of the excitation electrode 2A and the combination electrode 110 are enlarged in scale with respect to the quartz chip 2.

The orientation of cutting and the size of the quartz chip 2 are set so that the quartz chip 2 oscillates at a predetermined natural frequency. The size of the quartz chip 2 is set to 3.2 mm in length (transverse direction in the drawing), 2.5 mm in width (direction perpendicular to the drawing), and 1 mm in thickness. The combined electrode 110 may be a nichrome thin-film having a thickness of about 0.1 μm, and can be formed on the quarts chip 2 by a sputtering method or a vapor deposition method. It should be noted that an interval between the bottom surface of the quartz chip 2 and the upper surface of the IC 30 is about 0.3 mm. However those numerical values are mere examples, and the size of the quartz chip 2 or the interval between the bottom surface of the quartz chip 2 and the upper surface of the IC 30 may be set in accordance with the oscillation frequency and other setting items.

Also in FIG. 4B, the combined electrode 110 is a part of a closed circuit containing the compensation circuit 40 and the coil 11, and the combined electrode 110 makes a pair with the excitation electrode 2A and forms a loop containing the variable capacitor 31 and the inverter 32.

Because the circuit containing the compensation circuit 40 and the coil 111 and a circuit containing the variable capacitor 31 are connected to the combined electrode 110, as illustrated by symbolic elements in FIG. 5, a direct current corresponding to the temperature of the quartz chip 2 flows in the combined electrode 110 and also an oscillation signal (alternate current component) flows in the combined electrode 110. However, because the alternate current component is intercepted by the coil 111, only the direct current flows in the closed circuit containing the compensation circuit 40 and the coil 111, and only an electric current value indicating the temperature detected by the combined electrode 110 is input to the compensation circuit 40. Additionally, because the direct current is intercepted by the variable capacitor 31, only the oscillation signal, which is an alternate current component, is input to the inverter 32.

Figure 6:
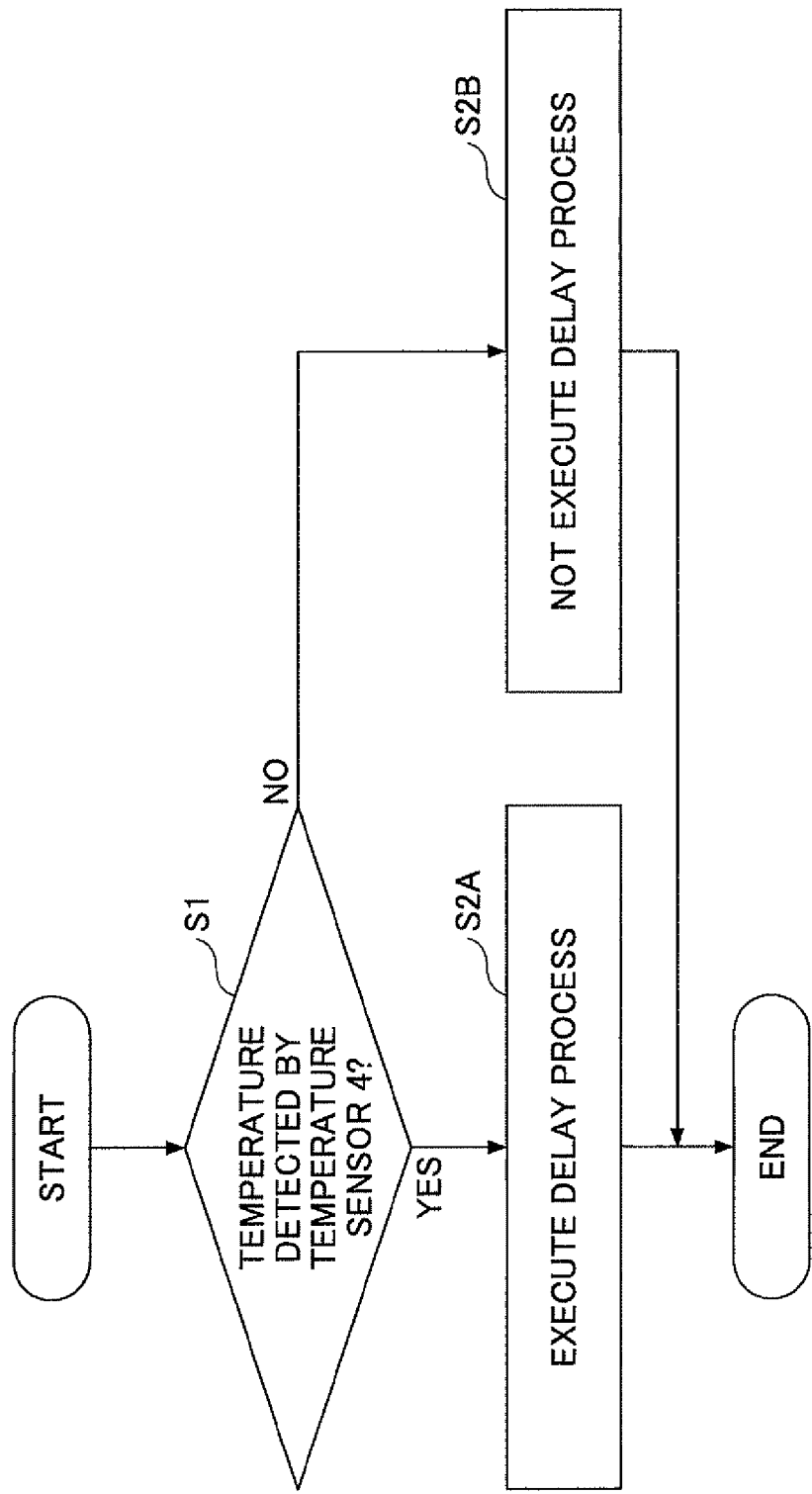
FIG. 6 is a flowchart of a delay process performed by a delay switch control section of the temperature compensated crystal oscillator according to the first embodiment.

FIG. 6 is a flowchart of a delay process performed by the delay switch control section 43 of the temperature compensated crystal oscillator 100 according to the first embodiment.

The delay switch control section 43 determines whether an electric current value output from the selection section 41 corresponds to a temperature detected by the temperature sensor 4 or the combined electrode 110 (step S1). As mentioned above, this determination is performed based on the control instruction to cause the selection section 41 to switch the changeover switch.

If it is determined that the electric current value corresponds to a temperature detected by the temperature sensor 4 (YES of step S1), the delay switch control section 43 changes the delay section 42 to be in a state of performing a delay process (step S2A). The delay process is performed to achieve an accurate temperature compensation by using the temperature detected by the temperature sensor 4, which is positioned on a thermally upstream side of the combined electrode 110, because it is considered that a temperature difference is generated between the temperature detected by the combined electrode 110 and the temperature detected by the temperature sensor 4 due to rapid temperature rise.

On the other hand, if it is determined that the electric current value corresponds to the temperature detected by the combined electrode 110 (NO of step S1), the delay switch control section 43 changes the delay section 42 to be in a state where the delay section 42 does not perform the delay process (step S2A). The delay process is not performed to achieve an accurate temperature compensation by using the temperature detected by the combined electrode 110, which is attached to the quartz chip 2 because it is considered that there is no rapid temperature rise generated and the temperature detected by the combined electrode 110 indicates an actual temperature of the quartz chip 2

As mentioned above, the delay switch control section 43 switches the state of the delay section 42 between execution and inexecution of the delay process.

Figure 7:
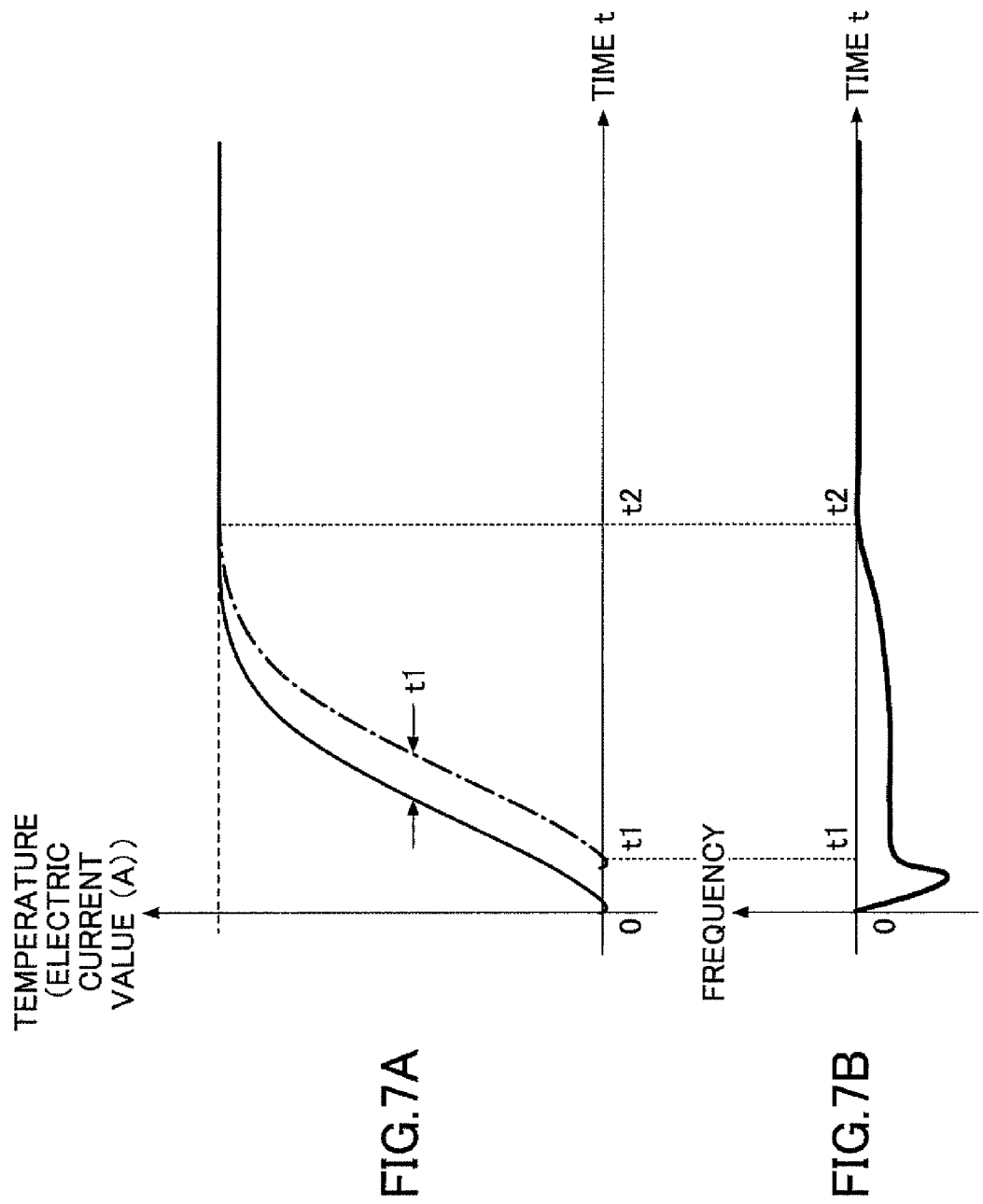
FIGS. 7A and 7B are graphs illustrating a fluctuation in an oscillation frequency due to a control delay.

FIGS. 7A and 7B are graphs illustrating a fluctuation in an oscillation frequency due to a control delay when the temperature of the combined electrode 110 rises rapidly. In FIG. 7A, the vertical axis represents an electric current value corresponding to the temperature detected by the combined electrode 110, and the horizontal axis is a time axis. In FIG. 7B, the vertical axis represents a frequency of the oscillation signal output from the output buffer circuit 33, and the horizontal axis is a time axis. It should be noted that the characteristic illustrated in FIGS. 7A and 7B is presented for the purpose of comparison and explanation, and the characteristic illustrated does not correspond to the characteristic of the temperature compensated crystal oscillator 100 according to the present embodiment.

It is assumed that a rapid temperature rise occurs in the combined electrode 110 at a time t=0, and a degree of the temperature rise is sufficient to generate a control delay in the feedback control. Under this circumstance, the actual temperature of the quartz chip 2 rises as indicated by a solid line. On the other hand, the electric current value, which corresponds to the temperature detected by the combined electrode 110 and used for the feedback control, follows the rise of the actual temperature of the quartz chip 2 with a delay by a time t1, which is a control delay, as indicated by a single dashed chain line.

If such a control delay occurs in the temperature information used for the feedback control, a delay of the time t1 occurs in the control of the electrostatic capacitance of the variable capacitor 31. Thereby, a relatively large fluctuation occurs in the oscillation frequency immediately after the time t=0. Because the fluctuation in the oscillation frequency continues until a time t=2 (>>t1), there is generated a time period during which the temperature compensation of the oscillation frequency cannot be performed accurately.

Figure 8:
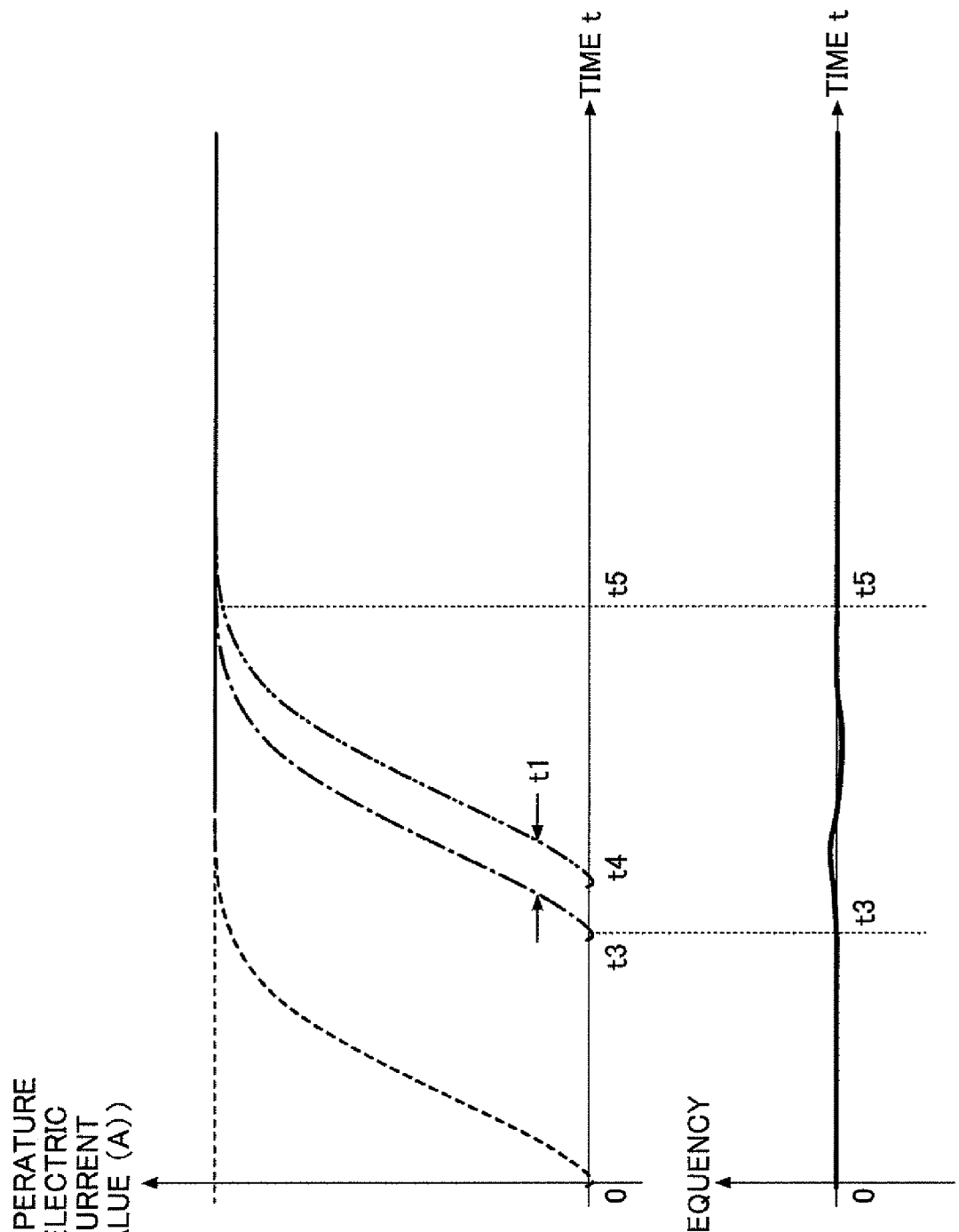
FIGS. 8A and 8B are graphs conceptually illustrating a process of delaying an electric current value as temperature information output from a temperature sensor in the temperature compensated crystal oscillator according to the first embodiment.

FIGS. 8A and 8B are graphs conceptually illustrating a process of delaying the electric current value as the temperature information output from the temperature sensor 4 in the temperature compensated crystal oscillator 100 according to the present embodiment. In FIG. 8A, the vertical axis represents an electric current value corresponding to the temperature detected by the temperature sensor 4, and the horizontal axis is a time axis. In FIG. 8B, the vertical axis represents a frequency of the oscillation signal output from the output buffer circuit 33, and the horizontal axis is a time axis. The delay process illustrated by FIGS. 8A and 8B is performed by the delay section 42.

In the temperature compensated crystal oscillator 100 according to the present embodiment, as mentioned above, if the difference between the temperatures detected by the temperature sensor 4 and the combined electrode 110 is equal to or greater than a predetermined threshold value, the electric current value indicating the temperature detected by the temperature sensor 4 is output from the selection section 41. In this case, because the state of the delay section 42 is changed by the delay switch control section 43 to the state where the delay process is executed, the detection value of the temperature sensor indicated by a dashed line is input to the compensation section 44 with a delay of a predetermined time t3.

Here, if the difference between the temperatures detected by the temperature sensor 4 and the combined electrode 110 is equal to or greater than the predetermined threshold value, the predetermined time t3 for delay is represented as t3=t4−t1, where t4 is a delay time from a time when the temperature sensor 4 detects a certain temperature and until a time when the combined electrode 110 detects the same temperature as that detected by the temperature sensor 4. Thus, an electric current value as temperature information output by the temperature sensor 4 is output with a delay of the time t3 as indicated by a single-dashed chain line in FIG. 8A, and is input to the compensation section 44.

The actual temperature of the quartz chip 2 rises with a delay of the delay time t4 with respect to the temperature detected by the temperature sensor 4, as indicated by a double-dashed chain line in FIG. 8A. Thus, a compensation voltage based on the temperature information representing the actual temperature change of the quartz chip 2 can be output from the compensation section 44 by inputting the temperature information rising at a time earlier by the control delay time t1 to the compensation section 44.

Therefore, the temperature compensated crystal oscillator 100 according to the present embodiment is capable of performing an accurate temperature compensation of the oscillation frequency by suppressing an influence of the delay time in the heat transfer to the temperature sensor 4 and the combination electrode 110 and an influence of the control delay time.

It should be noted that the temperature compensated crystal oscillator 100 according to the present embodiment generates the compensation voltage, when a temperature is detected by the temperature sensor 4 as indicated by the dashed line in FIG. 8A, by using the temperature characteristic indicated by the single-dashed chain line, which is obtained by delaying the temperature detected by the temperature sensor 4 by the predetermined time (t3) which is obtained by subtracting the control delay time (t1) from the delay time (t4) of heat transfer. Thus, even if the temperature sensor 4 detects a temperature at the time t=0, the temperature compensation is not performed until the time t=t3.

On the other hand, if the difference in the temperatures detected by the temperature sensor 4 and the combined electrode 110 is smaller than the predetermined threshold value, the output of the selection section 41 is switched from an electric current value corresponding to the temperature detected by the temperature sensor 4 to an electric current value corresponding to the temperature detected by the combined electrode 110. This is because the difference between a degree of increase in the temperature detected by the temperature sensor 4 and a degree of increase in the temperature detected by the combined electrode 110 becomes smaller than the predetermined threshold value. Thus, the compensation voltage at a time around t5 indicated in FIGS. 8A and 8B is generated based on the electric current value corresponding to the temperature detected by the combined electrode 110.

According to the temperature compensated crystal oscillator 100 according to the present embodiment, even in a case where a rapid temperature rise occurs, the temperature of the quartz chip 2 can be grasped accurately by delaying the temperature information obtained by the temperature sensor 4. Thus, even in a condition where the temperature rise is excessively rapid and a control delay is generated by the temperature information obtained by the combined electrode 110, the temperature of the quartz chip 2 can be accurately derived, which achieves an accurate control of the electrostatic capacitance of the variable capacitor 31. Thus, there is provided according to the first embodiment the temperature compensated crystal oscillator 100, which is capable of performing temperature compensation of the oscillation frequency accurately and properly even if an environmental temperature fluctuates rapidly.

It should be noted that the description has been given of the compensation circuit 40, which includes the selection section 41, the delay section 42, the delay switch control section 43, the compensation section 44 and the memory 45. However, the compensation circuit 40 is not limited to the circuit structure described above, and other circuit structures may be used if a temperature compensation of the oscillation frequency can be performed based on the temperature detected by the temperature sensor 4, the delay time of heat transfer, and the control delay, when a degree of increase in the temperature detected by the temperature sensor 4 is greater than a degree of increase in the temperature detected by the combined electrode 110 by a predetermined degree.

Figure 9:
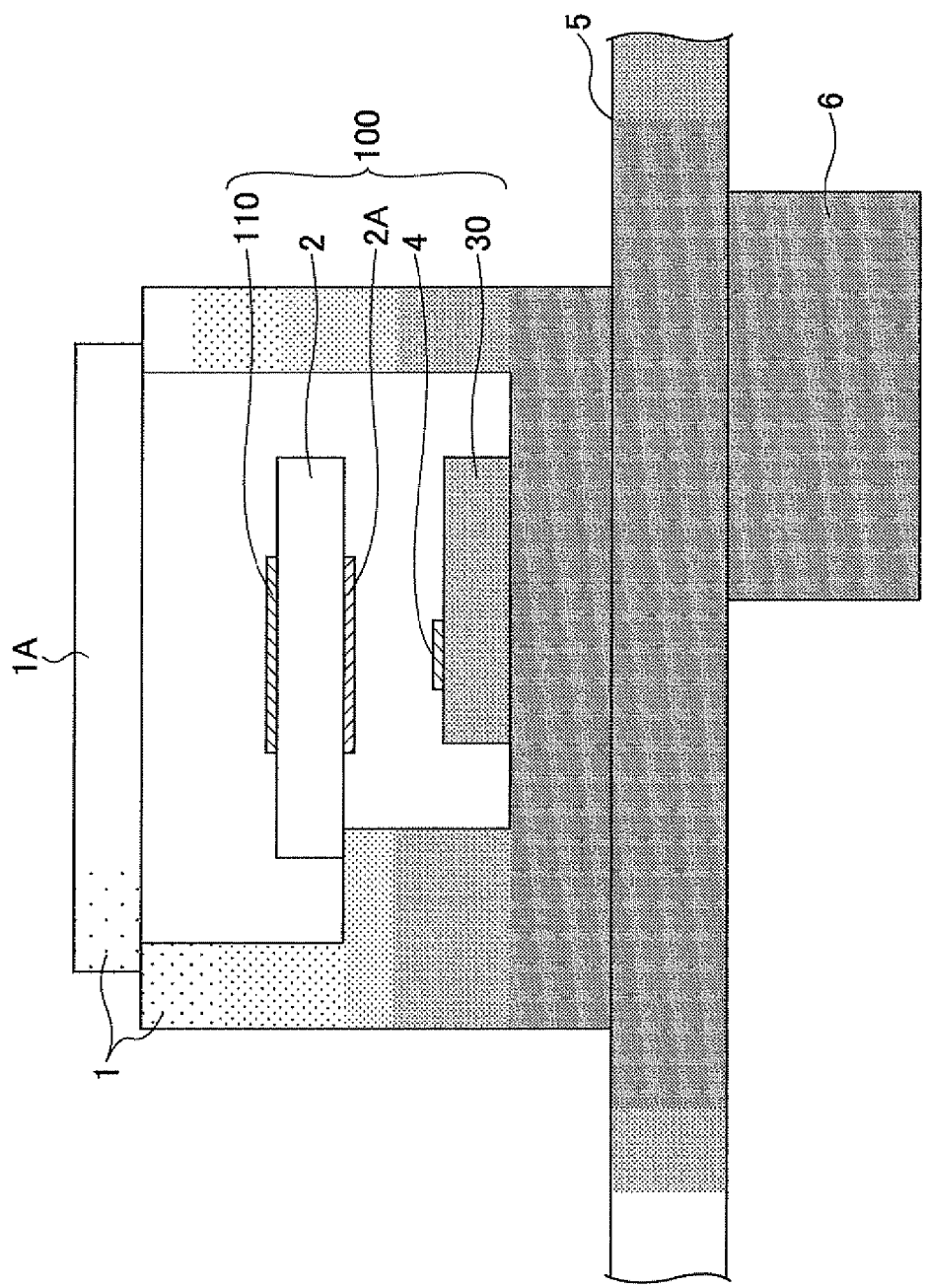
FIG. 9 is an illustration illustrating a temperature distribution in the temperature compensated crystal oscillator when a heat is transferred from a heat-generating source.

FIG. 9 is an illustration illustrating a temperature distribution in the temperature compensated crystal oscillator 100 when a heat is transferred from a heat-generating source. In FIG. 9, a darker portion is at a higher temperature.

The housing 1, which accommodates the components of temperature compensated crystal oscillator 100, is mounted to a front surface of the printed circuit board 5, and a power amplifier 6 is mounted to a back surface of the printed circuit board 5. The power amplifier 6 corresponds to an external heat source of the temperature compensated crystal oscillator 100. The printed circuit board 5 including the temperature compensated crystal oscillator 100 and the power amplifier 6 is incorporated into, for example, an electronic equipment performing a communication, such as a cellular phone. The power amplifier 6 generates a heat when the electronic equipment performs a communication. Especially, the power amplifier 6 generates a large amount of heat when starting a communication, and, thereby the temperature of the power amplifier 6 rises rapidly.

If the temperature rises rapidly as mentioned above, the heat of the power amplifier 6 is transferred to the housing 1 through the printed circuit board 5. The heat reached the housing 1 is then transferred from a bottom part of the housing 1 to the components of the temperature compensated crystal oscillator 100.

Accordingly, the temperature of the IC 30, which is closer to the printed circuit board 5 than the quartz chip 2, is higher than the temperature of the quartz chip 2, which is farther to the printed circuit board 5 than the IC 30. The temperature distribution appears in the difference between the temperatures detected by the temperature sensor 4 and the combined electrode 110. The temperature compensated crystal oscillator 100 can eliminate a problem caused by the temperature distribution illustrated in FIG. 9.

FIG. 10A is perspective view of a cellular phone provided with the temperature compensated crystal oscillator 100 according to the first embodiment. FIG. 10B is a perspective view of a printed circuit board incorporated into the cellular phone 50 illustrated in FIG. 10A.

The cellular phone 50 illustrated in FIG. 10A is provided with a printed circuit board 5 on which circuits for communication are mounted. A communication circuit part 51 and the temperature compensated crystal oscillator 100 are mounted on the printed circuit board 5.

With miniaturization and multi-functionalization, the cellular phone 50 has a limited space in a housing thereof. There may be a case where the temperature compensated crystal oscillator 100 is located in the vicinity of a heat-generating source. A power amplifier such as illustrated in FIG. 9 is a typical heat-generating source. The power amplifier generates a heat when a communication is started, and, thereby, the temperature of the temperature compensated crystal oscillator 100 may rise rapidly by receiving a large amount of heat transferred from the power amplifier through the printed circuit board 5.

In such a case, the temperature compensated crystal oscillator 100 according to the first embodiment can derive the temperature of the quartz chip 2 accurately by delaying the temperature information obtained by the temperature sensor 4, thereby performing an accurate temperature compensation of the oscillation frequency. Thus, the communication or various processing of the cellular phone 50 can be performed accurately.

When using the oscillation signal of the temperature compensated crystal oscillator 100 as a reference clock signal of the cellular phone 50, or using as a reference clock of a global positioning system (GPS) function, the clock signal requires an extremely high accuracy. Thus, using the temperature compensated crystal oscillator 100 in equipment requiring an extremely high accuracy for the clock signal, such as the cellular phone 50, is very much effective.

It should be noted that although the cellular phone 50 is illustrated in FIG. 10A as an example of an electronic equipment provided with the temperature compensated crystal oscillator 100, the electronic equipment provided with the temperature compensated crystal oscillator 100 is not limited to the cellular phone 50, and temperature compensated crystal oscillator 100 may be suitable for other electronic equipments requiring an accurate temperature compensation of the oscillation frequency.

Figure 11:
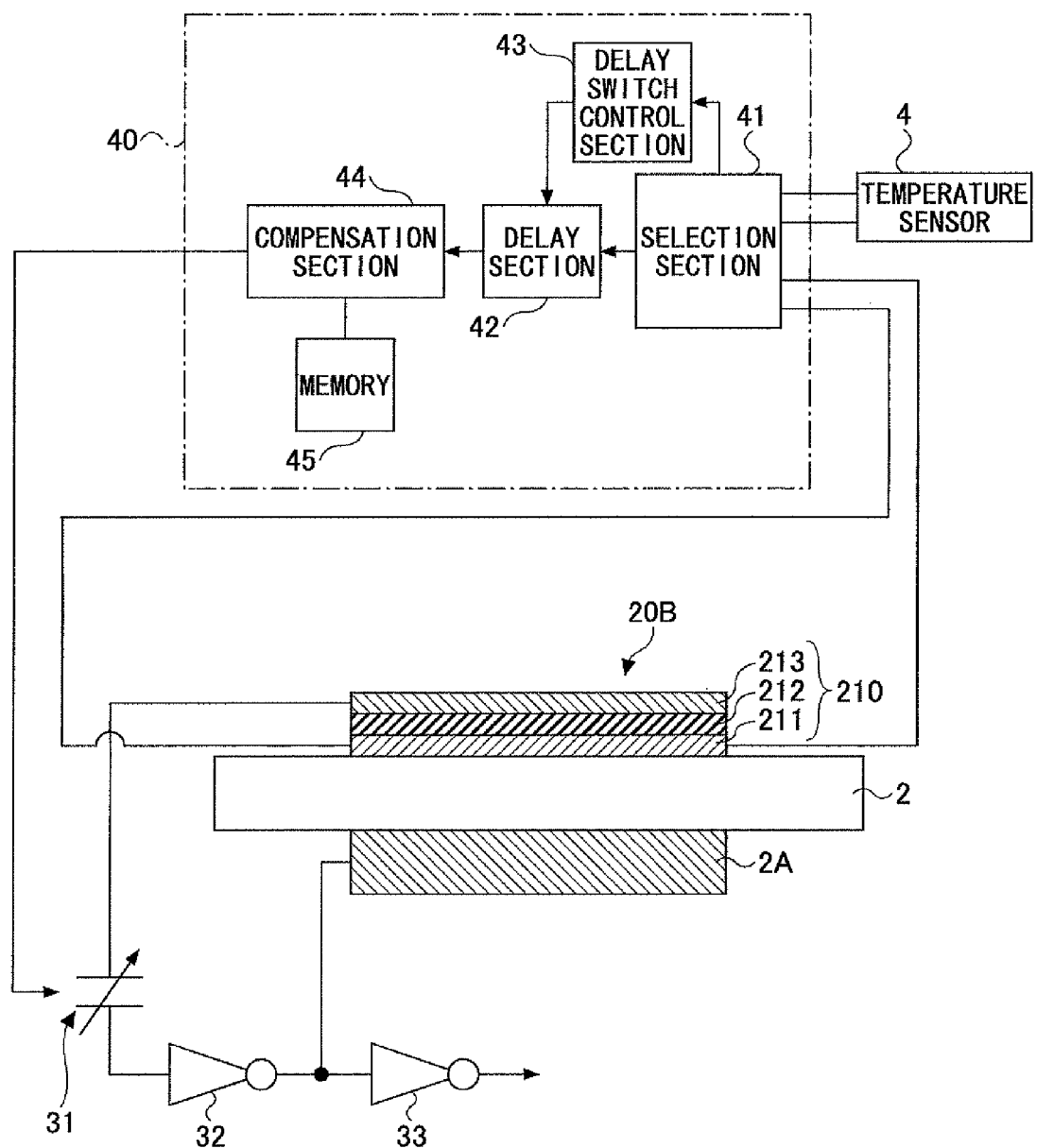
FIG. 11 is a circuit diagram of a temperature compensated crystal oscillator according to a second embodiment in which a quartz resonator is illustrated in a cross-sectional view.
Figure 12:
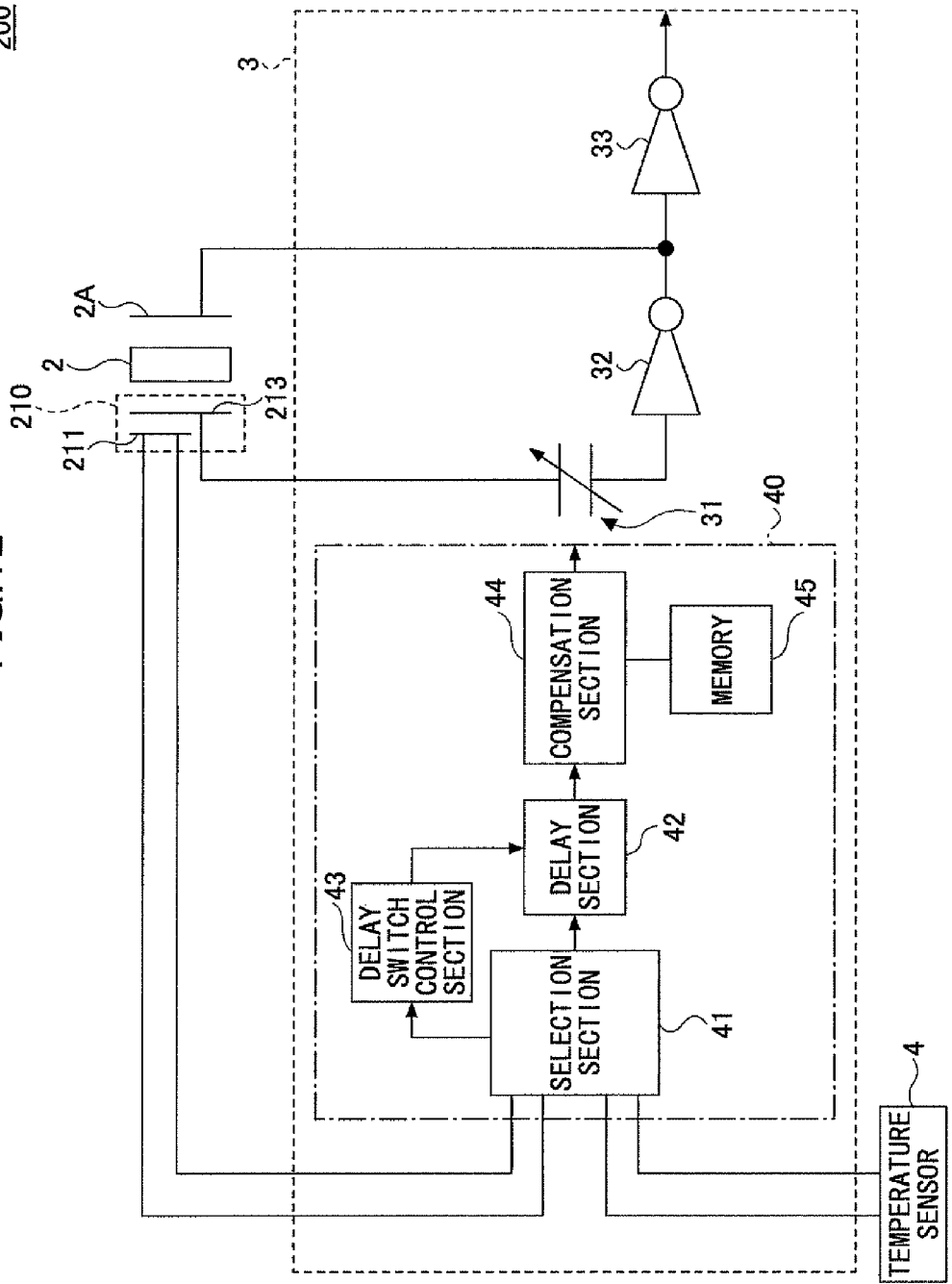
FIG. 12 is a circuit diagram of the temperature compensated crystal oscillator according to the second embodiment in which the quartz resonator is illustrated by symbolic elements.

A description will be given, with reference to FIG. 11 and FIG. 12, of a temperature compensated crystal oscillator 200 according to a second embodiment. In FIG. 11, a quartz chip 2, an excitation electrode 2A and a combined electrode 210 are illustrated in cross-sectional views. In FIG. 12, the quartz chip 2, the excitation electrode 2A and the combined electrode 210 are illustrated by symbolic elements. The quartz chip 2, the excitation electrode 2A and the combined electrode 210 together form a quartz resonator 20B.

The temperature compensated crystal oscillator 200 according to the second embodiment has the same structure as the temperature compensated crystal oscillator 100 according to the first embodiment except for the structure of the combined electrode 210 as a first electrode. As illustrated in FIG. 11, the combined electrode 210 is a lamination of a temperature detecting electrode 211, an insulating layer 212 and a voltage applying electrode 213. The temperature detecting electrode 211 is for detecting a temperature of the quartz chip 2. The temperature detecting electrode 211 is connected to the compensation circuit 40 to form a closed circuit. The voltage applying electrode 213 is for applying a voltage to the quartz chip 2. The voltage applying electrode 213 makes a pair with the excitation electrode 2A and is connected to the variable capacitor 31 and the inverter 32 to form a loop for an oscillation circuit.

It should be noted that the temperature detecting electrode 211 and the voltage applying electrode 213 are insulated from each other by the insulating layer 212, and, thereby, the closed circuit for temperature compensation and the loop for the oscillation circuit are separated from each other. Thus, there is no need to provide a coil for intercepting an alternate current in the second embodiment.

Moreover, the position at which the combined electrode 210 is located on the front surface of the quartz chip 2 is the same as the combined electrode 110 of the first embodiment.

Further, the temperature detecting electrode 211 can be a temperature detecting element, which can detect a temperature of the quartz chip 2. For example, the temperature detecting electrode 211 may be formed of a nichrome thin-film. The insulating layer 212 can be a thin-film layer which can electrically insulate the temperature detecting electrode 211 and the voltage applying electrode 213 from each other. For example, the insulating layer 212 may be formed of a silicon oxide layer. The voltage applying electrode 213 can be a thin-film electrode, which makes a pair with the excitation electrode 2A to apply a voltage to the quartz chip 2. For example, the voltage applying electrode 213 may be formed of a gold (Au) thin-film.

The nichrome thin-film as the temperature detecting electrode 211, the silicone oxide as the insulating layer 212, and the gold thin-film as the voltage applying electrode 213 can be formed using, for example, a vapor deposition method or a sputtering method. That is, the combined electrode 210 is formed by forming the temperature detecting electrode 211 on the surface of the quartz chip 2, and, then, forming the insulating layer 212 on the temperature detecting electrode 211, and, thereafter, forming the voltage applying electrode 213 on the insulating layer 212. It should be noted that the materials and the method of forming the temperature detecting electrode 211, the insulating layer 212 and the voltage applying electrode 213 are not limited to the above-mentioned materials and method.

In FIG. 12, the combined electrode 210 and the excitation electrode 2A of the temperature compensated crystal oscillator 200 having the above-mentioned structure are illustrated by circuit symbols. Because the temperature detecting electrode 211 and the voltage applying electrode 213 of the combined electrode 210 are separated and insulated from each other, the closed circuit for temperature compensation containing the compensation circuit 40 and the loop for oscillation circuit containing the variable capacitor and the inverter 32 are completely separated and insulated from each other.

A direct electric current corresponding to the temperature detected by the temperature detecting electrode 211 flows to the compensation circuit 40, and the direct electric current is converted into a compensation voltage by the compensation circuit 40 and the compensation voltage is output to the variable capacitor 31. Thus, the electrostatic capacitance of the variable capacitor 31 is accurately controlled based on the temperature (an electric current value corresponding to the temperature) accurately detected by the temperature detecting electrode 211. Accordingly, the oscillation frequency generated by the oscillation circuit containing the variable capacitor and the inverter 32 is compensated accurately according to the temperature of the quartz chip 2.

As mentioned above, according to the second embodiment, a temperature of the quartz chip 2 can be accurately derived by suppressing influences of the delay time of heat transfer and the control delay time by delaying the temperature information obtained by the temperature sensor 4, which is close to a heat-generating source. Thus, the temperature compensated crystal oscillator 200 is capable of performing an accurate temperature compensation of the oscillation frequency. Especially, the temperature compensated crystal oscillator 200 according to the second embodiment is suitable for a high-speed process in which a control delay causes a problem.

Figure 13:
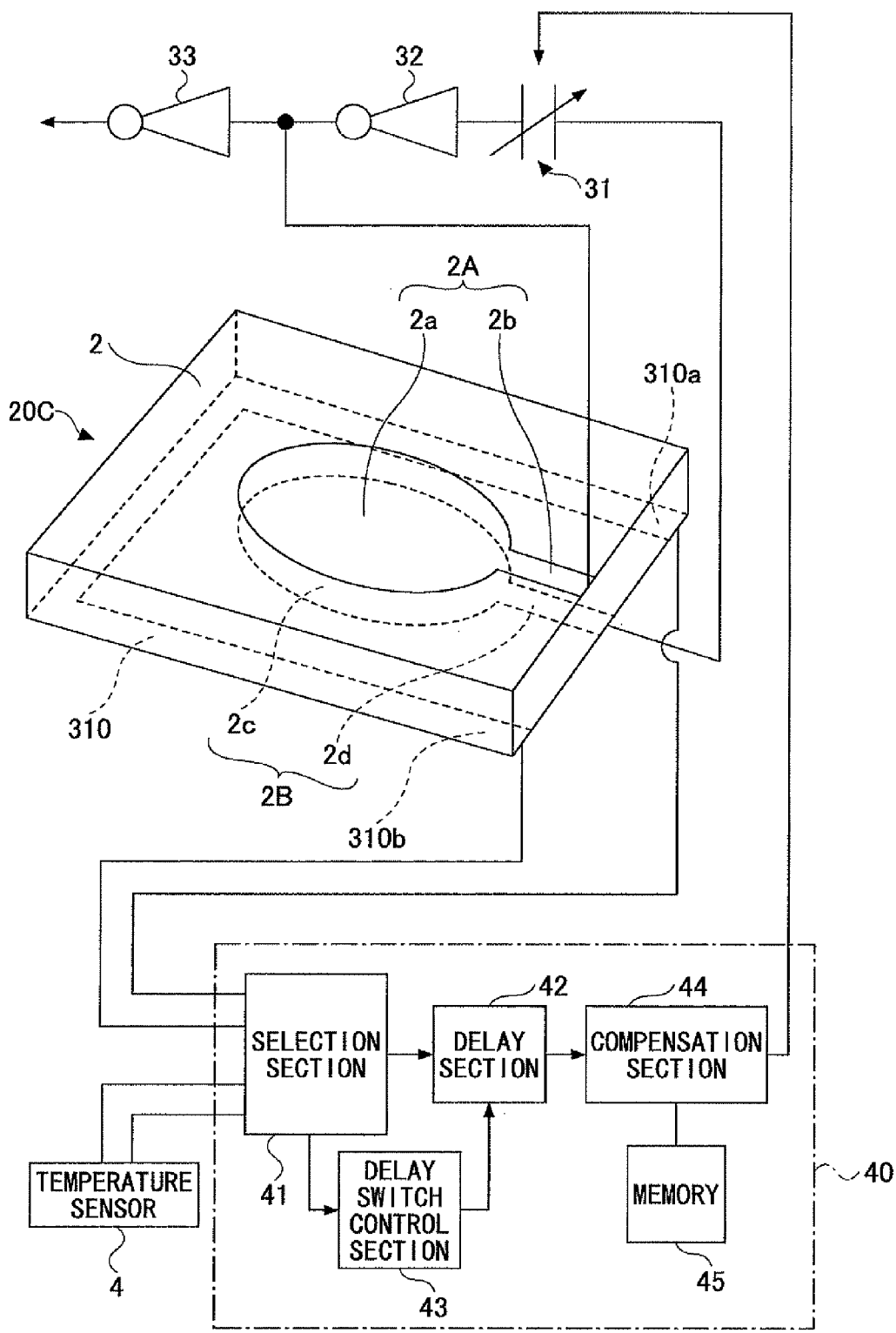
FIG. 13 is a circuit diagram of a temperature compensated crystal oscillator according to a third embodiment in which a quartz resonator is illustrated in a perspective view.
Figure 14:
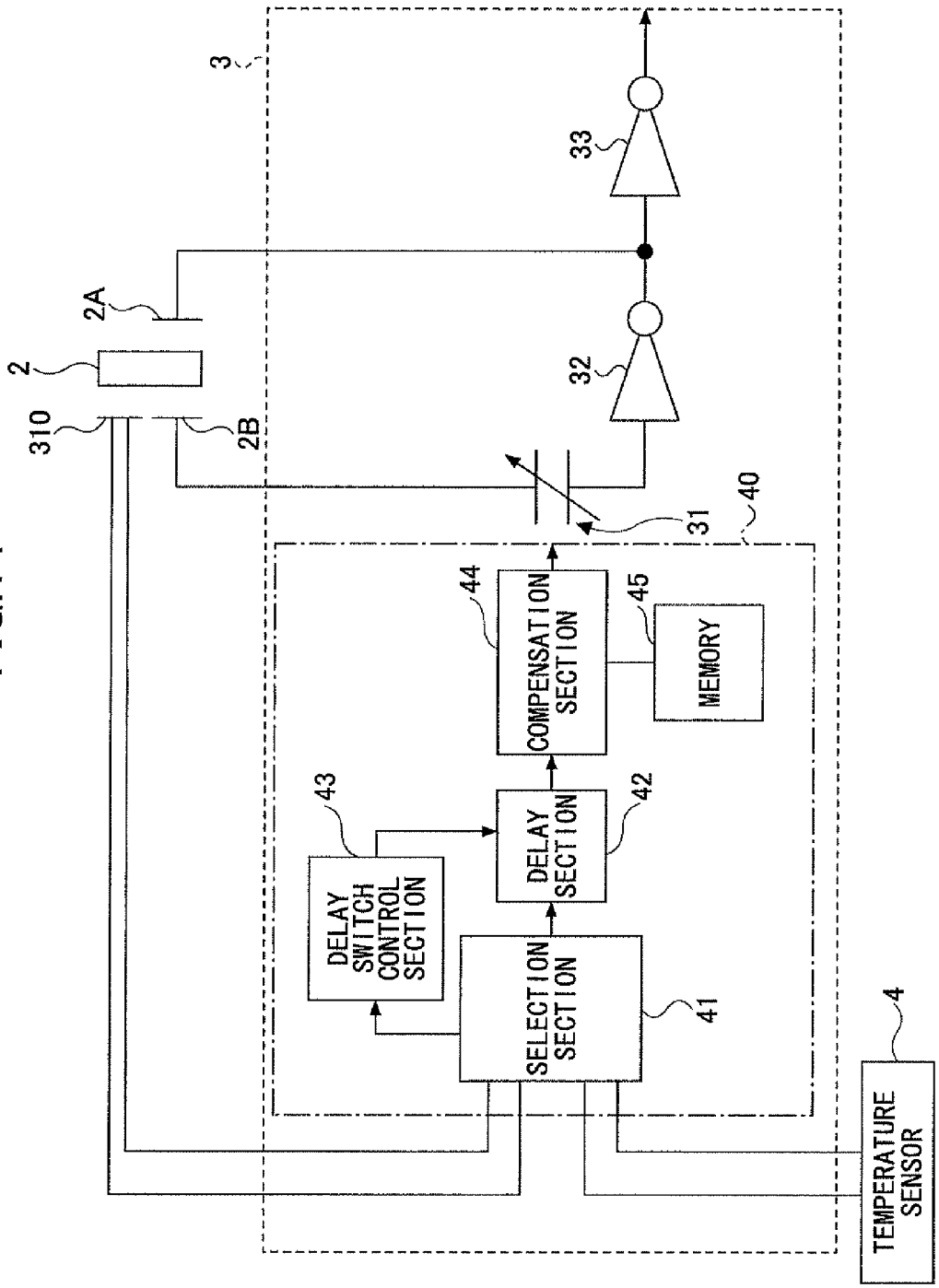
FIG. 14 is a circuit diagram of the temperature compensated crystal oscillator according to the third embodiment in which the quartz resonator is illustrated by symbolic elements.

A description will be given, with reference to FIG. 13 and FIG. 14, of a temperature compensated crystal oscillator 300 according to a third embodiment. In FIG. 13, a quartz chip 2, excitation electrodes 2A and 2B and a temperature sensor 310 are illustrated in cross-sectional views. In FIG. 14, the quartz chip 2, the excitation electrodes 2A and 2B and the temperature sensor 310 are illustrated by symbolic elements. The quartz chip 2, the excitation electrodes 2A and 2B and the temperature sensor 310 together form a quartz resonator 20C.

The temperature compensated crystal oscillator 300 according to the third embodiment has the same structure as the temperature compensated crystal oscillator 100 according to the first embodiment except that a pair of electrodes 2A and 2B are attached to the quartz chip 2 and the temperature sensor 310 is attached to the surface of the quartz chip 2 on which surface the excitation electrode 2B is attached. The temperature sensor 310 serves as a second temperature detecting element to detect a temperature of the quartz chip 2.

The excitation electrode 2A is positioned in the center portion of the bottom surface of the quartz chip 2. The excitation electrode 2A includes an electrode part 2a having an elliptical shape in a plan view and an extending part 2b extending from the electrode part 2a. Similarly, the excitation electrode 2B is positioned in the center portion of the top surface of the quartz chip 2. The excitation electrode 2B includes an electrode part 2c having an elliptical shape in a plan view and an extending part 2d extending from the electrode part 2c. The configuration of the excitation electrode 2A is the same as that of the excitation electrode 2B.

The temperature sensor 310 is formed on the top surface of the quartz chip 2, on which the excitation electrode 2B is provided, in a state where the temperature sensor 310 is separated and insulated from the excitation electrode 2B. The temperature sensor 310 is U-shaped in all corners in straight angles in a plan view so that the temperature sensor 310 extends along three sides of the top surface of the quartz chip 2 (Note that the quartz chip 2 is illustrated upside down in FIG. 13). The temperature sensor 310 may be any temperature detecting element, which can detect the temperature of the quartz chip 2. For example, a nichrome thin-film may be used for the temperature sensor 310. The nichrome thin-film can be formed by a sputtering method or a vapor deposition method. The material and method of forming the temperature sensor 310 are not limited to the above-mentioned material and method, and other materials and methods may be used.

Although the temperature sensor 310 illustrated in FIG. 13 has a U-shape to extend along the three sides of the top surface of the quartz chip 2, the shape of the temperature sensor 310 is not limited to a U-shape, and other shapes may be used. Additionally, the position where the temperature sensor 310 is located is not limited to the position indicated in FIG. 13, and any positions on the top surface of the quartz chip 2 may be adopted. However, because the quarts chip 2 must oscillate at a predetermined natural frequency, the mass of the temperature sensor 310 and the position at which the temperature 310 is located must be determined in consideration of the natural frequency of the quartz chip 2.

The extending part 2b of the excitation electrode 2A is connected to the output side of the inverter 32, and the extending part 2d of the excitation electrode 2B is connected to the input side of the variable capacitor 31. Thereby, a loop for the oscillation circuit, which contains the excitation electrodes 2A and 2B, the variable capacitor 31 and the inverter 32, is formed.

Moreover, the compensation circuit 40 is connected between opposite ends 310a and 310b of the temperature sensor 310 in order to form a closed circuit for temperature compensation. Because the closed circuit for temperature compensation and the loop for oscillation circuit are separated from each other, there is no need to provide a coil for intercepting an alternate current such as in the first embodiment.

FIG. 14 illustrates the temperature sensor 310 and the excitation electrodes 2A and 2B of the temperature compensated crystal oscillator 300 having the above-mentioned structure by circuit symbols. Because the excitation electrode 2B and the temperature sensor 40 are separated and insulated from each other, the closed circuit for temperature compensation containing the compensation circuit 40 and the loop for the oscillation circuit containing the variable capacitor 31 and the inverter 32 are completely separated from each other.

A direct electric current corresponding to the temperature detected by the temperature sensor 310 flows to the compensation circuit 40. The direct electric current is converted into a compensation voltage by the compensation circuit 40, and the compensation voltage is output to the variable capacitor 31. Accordingly, the electrostatic capacitance of the variable capacitor 31 is accurately controlled based on the temperature accurately detected by the temperature sensor 310. Thus, the oscillation frequency generated by the oscillation circuit containing the variable capacitor 31 and the inverter 32 is accurately temperature-compensated in accordance with the temperature of the quartz chip 2.

As mentioned above, according to the third embodiment, a temperature of the quartz chip 2 can be accurately derived by suppressing influences of the delay time of heat transfer and the control delay time by delaying the temperature information obtained by the temperature sensor 4, which is close to a heat-generating source. Thus, the temperature compensated crystal oscillator 300 is capable of performing an accurate temperature compensation of the oscillation frequency. Especially, the temperature compensated crystal oscillator 300 according to the third embodiment is suitable for a high-speed process in which a control delay causes a problem.

It should be noted that although only one temperature sensor (temperature sensor 310) is attached to the quartz chip 2 in the third embodiment, a plurality of temperature sensors may be attached to the quartz chip 2.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A temperature compensated crystal oscillator mounted to a board, comprising:
    a quartz resonator including a quartz chip generating an oscillation frequency;
    a temperature dependent resistive element formed on said quartz chip, said resistive element serving as one of a pair of excitation electrodes of said quartz resonator;
    a temperature sensor located closer to the board than said quartz resonator; and
    a compensation part configured to compensate for a change in the oscillation frequency generated by said quartz resonator based on a value of a current flowing in said resistive element and an output of said temperature sensor.

2. The temperature compensated crystal oscillator according to claim 1, further comprising a memory storing information regarding the value of the current flowing in said resistive element, the output of said temperature sensor and an amount of compensation of the oscillation frequency, and wherein said compensation part performs compensation by referring to the information stored in said memory.

3. A printed circuit board assembly comprising:
    a printed circuit board; and
    the temperature compensated crystal oscillator according to claim 1 mounted on said printed circuit board.

4. The printed circuit board assembly according to claim 3, wherein said temperature compensated crystal oscillator includes a memory storing information regarding the value of the current flowing in said resistive element, the output of said temperature sensor and an amount of compensation of the oscillation frequency, and wherein said compensation part performs compensation by referring to the information stored in said memory.

5. An electronic equipment comprising:
    the temperature compensated crystal oscillator according to claim 1; and
    an electronic part using the oscillation frequency generated by said temperature compensated crystal oscillator.

6. The electronic equipment according to claim 5, wherein said temperature compensated crystal oscillator includes a memory storing information regarding the value of the current flowing in said resistive element, the output of said temperature sensor and an amount of compensation of the oscillation frequency, and wherein said compensation part performs compensation by referring to the information stored in said memory.

* * * * *